US012376224B2

(12) United States Patent
Lin et al.

(10) Patent No.: US 12,376,224 B2
(45) Date of Patent: Jul. 29, 2025

(54) PACKAGE DEVICE

(71) Applicant: InnoLux Corporation, Miao-Li County (TW)

(72) Inventors: Yi-Hung Lin, Miao-Li County (TW); Chun-Hung Lai, Miao-Li County (TW); Yeong-E Chen, Miao-Li County (TW); Chuan-Ming Yeh, Miao-Li County (TW); Ching-Wei Chen, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 514 days.

(21) Appl. No.: 17/736,112

(22) Filed: May 4, 2022

(65) Prior Publication Data

US 2023/0038309 A1    Feb. 9, 2023

(30) Foreign Application Priority Data

Aug. 6, 2021  (CN) .......................... 202110901265.9
Nov. 19, 2021  (CN) .......................... 202111392062.8

(51) Int. Cl.
*H05K 1/02*    (2006.01)
(52) U.S. Cl.
CPC ......... *H05K 1/0271* (2013.01); *H05K 1/0298* (2013.01)
(58) Field of Classification Search
CPC .......................... H05K 1/0271; H05K 1/0298; H01L 21/6835; H01L 23/49816; H01L 2221/68345; H01L 23/49822; H01L 24/04; H01L 24/07; H01L 2224/02331; H01L 2224/02333; H01L 2224/0235; H01L 2224/0236; H01L 2224/02371; H01L 2224/02379; H01L 2224/02381

See application file for complete search history.

(56) References Cited

U.S. PATENT DOCUMENTS

| 2008/0315413 | A1  | 12/2008 | Yamano |
| 2009/0008136 | A1* | 1/2009  | Ikeguchi .............. H05K 3/4641 29/843 |
| 2013/0249045 | A1* | 9/2013  | Kang ..................... H01L 23/562 257/499 |
| 2014/0021617 | A1  | 1/2014  | Lu |
| 2014/0290997 | A1* | 10/2014 | Maeda .............. H01L 23/49822 29/850 |
| 2016/0234929 | A1* | 8/2016  | Lee ...................... H05K 1/0271 |
| 2017/0142825 | A1* | 5/2017  | Hada ...................... G01B 21/20 |
| 2018/0166372 | A1* | 6/2018  | Shimizu .............. H05K 3/4644 |
| 2018/0233467 | A1  | 8/2018  | Lin |

(Continued)

FOREIGN PATENT DOCUMENTS

| CN | 101330027 A  | 12/2008 |
| CN | 112331621 A  | 2/2021  |

(Continued)

*Primary Examiner* — Timothy J Thompson
*Assistant Examiner* — Paramita Ghosh
(74) *Attorney, Agent, or Firm* — Winston Hsu

(57) ABSTRACT

A package device is provided and includes a first circuit layer, a first isolation layer, and a first de-warpage layer. The first circuit layer and the first isolation layer are stacked on each other. At least a portion of the first de-warpage layer is disposed between the first circuit layer and the first isolation layer.

20 Claims, 11 Drawing Sheets

(56) References Cited

U.S. PATENT DOCUMENTS

| | | |
|---|---|---|
| 2020/0411397 A1 | 12/2020 | Han |
| 2021/0066093 A1 | 3/2021 | Kim |
| 2021/0076491 A1 | 3/2021 | Kijima |
| 2022/0087016 A1* | 3/2022 | Aratani .................... H05K 3/18 |

FOREIGN PATENT DOCUMENTS

| | | |
|---|---|---|
| EP | 1 011 139 A1 | 6/2000 |
| KR | 10-2020-0028315 A | 3/2020 |
| TW | 202006904 A | 2/2020 |
| TW | 202025313 A | 7/2020 |

\* cited by examiner

PACKAGE DEVICE

BACKGROUND OF THE DISCLOSURE

1. Field of the Disclosure

The present disclosure relates to a package device, and more particularly to a package device having a de-warpage layer.

2. Description of the Prior Art

In packaging technology, plural package devices may be fabricated by performing a redistribution layer process on a carrier. During fabricating the redistribution layer, plural circuit layers and plural isolation layers are alternately formed. However, since stress is generated between one of the circuit layers and one of the isolation layers adjacent to each other, the formed circuit layers and the formed isolation layers may warp. As a result, upper circuit layer and lower circuit layer are easily misaligned during manufacturing, such that poor package devices or non-uniform package devices are produced.

SUMMARY OF THE DISCLOSURE

According to an embodiment of the present disclosure, a package device is provided and includes a first circuit layer, a first isolation layer, and a first de-warpage layer. The first circuit layer and the first isolation layer are stacked on each other. At least a portion of the first de-warpage layer is disposed between the first circuit layer and the first isolation layer.

These and other objectives of the present disclosure will no doubt become obvious to those of ordinary skill in the art after reading the following detailed description of the embodiment that is illustrated in the various figures and drawings.

DETAILED DESCRIPTION

Figure 1:
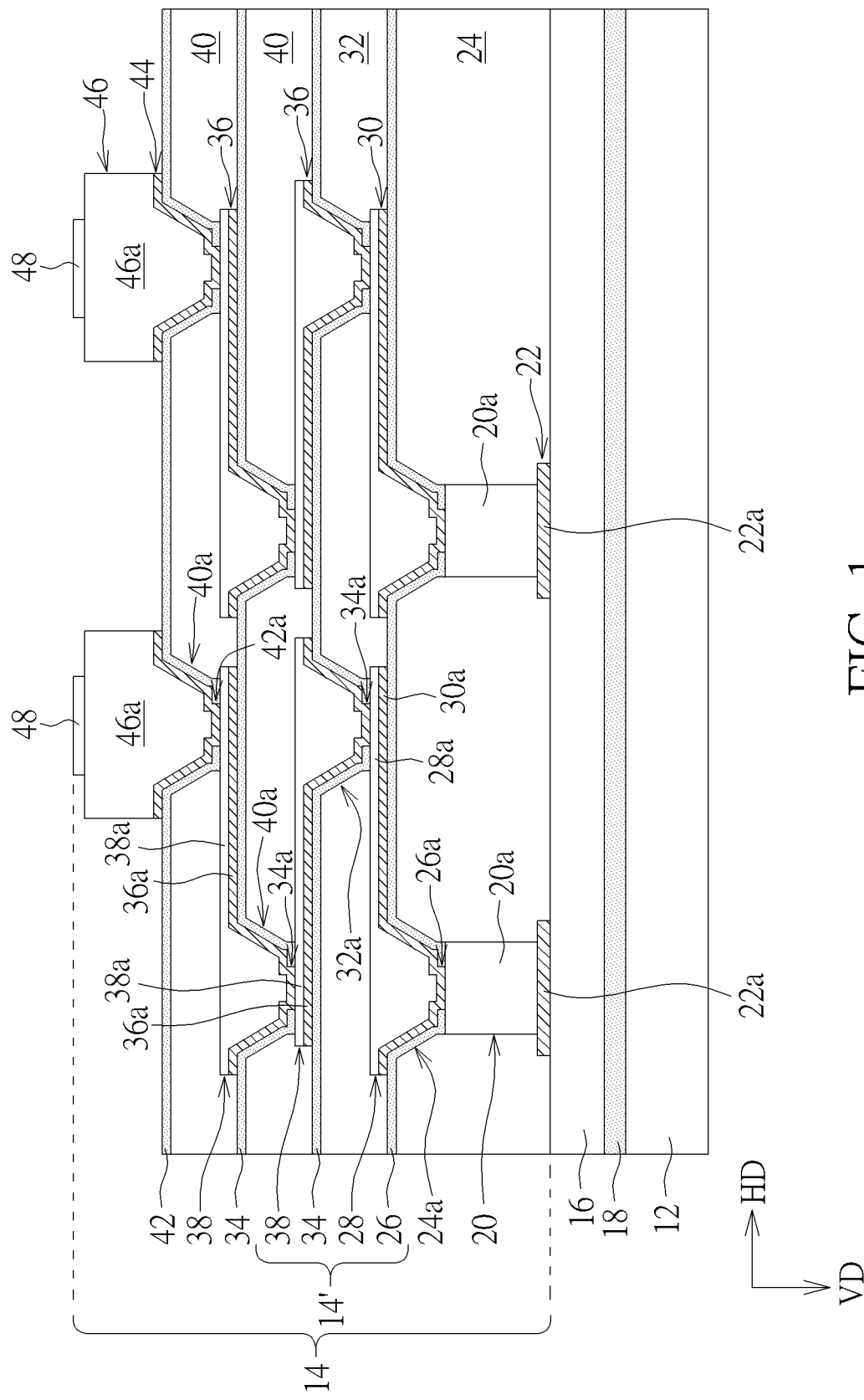
FIG. 1 and FIG. 2 schematically illustrate cross-sectional views of a manufacturing method of a package device according to a first embodiment of the present disclosure.

Hereinafter, contents of the present disclosure will be described in detail with reference to specific embodiments and drawings. In order to make the contents clearer and easier to understand, the following drawings may be simplified schematic diagrams, and components therein may not be drawn to scale. The numbers and sizes of the components in the drawings are just illustrative and are not intended to limit the scope of the present disclosure.

Certain terms are used throughout the specification and the appended claims of the present disclosure to refer to specific components. Those skilled in the art should understand that electronic equipment manufacturers may refer to a component by different names, and this document does not intend to distinguish between components that differ in name but not function. In the following description and claims, the terms "comprise", "include" and "have" are open-ended fashion, so they should be interpreted as "including but not limited to . . . ". It should also be understood that when a component is said to be "coupled" to another component (or a variant thereof), it may be directly connected to another component or indirectly connected (e.g., electrically connected) to another component through one or more components.

When ordinal numbers, such as "first" and "second", used in the specification and claims are used to modify components in the claims, they do not mean and represent that the claimed components have any previous ordinal numbers, nor do they represent the order of a claimed component and another claimed component, or the order of manufacturing methods. These ordinal numbers are just used to distinguish a claimed component with a certain name from another claimed component with the same name. Thus, a first component mentioned in the specification may be called a second component in claims.

Spatially relative terms, such as "above", "on", "beneath", "below", "under", "left", "right", "before", "front", "after", "behind" and the like, used in the following embodiments just refer to the directions in the drawings and are not intended to limit the present disclosure. It may be understood that the components in the drawings may be disposed in any kind of formation known by those skilled in the related art.

When a component or layer is called "on" or "above" another component or layer or is called "connected to" another component or layer, it may be understood that the component or layer may be directly on the another component or layer, or directly connected to the another component or layer, and alternatively, there may be other components or layers between them (indirectly). On the other hand, when a component or layer is called "directly on" or "directly connected to" another component or layer, it may be understood that there is no component or layer between them.

In this document, the terms "about", "substantially" and "approximately" usually mean within 10%, 5%, 3%, 2%, 1% or 0.5% of a given value or range. The quantity given here is about the quantity, that is, without specifying "about", "substantially" and "approximately", the meanings of "about", "substantially" and "approximately" may still be implied. In addition, the term "range from a first value to a second value" means that the range includes the first value, the second value and other values between them.

It should be understood that according to the following embodiments, features of different embodiments may be replaced, recombined or mixed to constitute other embodiments without departing from the spirit of the present disclosure. As long as the features of the embodiments do not violate the inventive spirit or conflict with each other, they can be mixed and used at will.

The electronic device of the present disclosure may include a package device, a display device, an antenna device, a touch display device, a curved display device, a lighting device, a diode device or a free shape display device but is not limited thereto. The electronic device may be a bendable or flexible electronic device. The electronic device may include, for example, a light emitting diode, liquid crystal molecules, a fluorescent material, a phosphor material, other suitable display medium, or a combination thereof, but not limited thereto. The light emitting diode may include, for example, an organic light-emitting diode (OLED), an inorganic light-emitting diode (LED), a mini-light-emitting diode (mini LED), a micro-light-emitting diode (micro-LED), a quantum dot (QD) light-emitting diode (such as QLED, or QDLED), other suitable materials or any combination thereof, but not limited thereto. The display device may include, for example, a tiled display device, but not limited thereto. The concepts or principles of the present disclosure may be applied to non-self-luminous liquid crystal display (LCD), but not limited thereto.

The antenna device may be, for example, a liquid crystal antenna or other types of antennas, but not limited thereto. The antenna device may include, for example, a tiled antenna device, but not limited thereto. It should be noted that, the electronic device may be any combination of the devices mentioned above, but not limited thereto. In addition, a shape of the electronic device may be rectangular, circular, polygonal, a shape with curved edges, or other suitable shapes. The electronic device may have a peripheral system such as a driving system, a control system, a light source system, a shelf system, etc. to support the display device, the antenna device or the tiled device. The electronic device of the present disclosure may be, for example, a display device, but not limited thereto.

In the present disclosure, length, thickness and the width may be measured by using an optical microscope, electron microscope or other methods, but not limited thereto.

Unless otherwise defined, all terms used herein (including technical and scientific terms) have the same meanings as those commonly understood by those skilled in the art to which the present disclosure belongs. It can be understood that these terms, such as those defined in commonly used dictionaries, should be interpreted as meanings consistent with the background or context of related technologies and the present disclosure, and should not be interpreted in an idealized or overly formal way, unless it is specifically defined in the embodiments of the present disclosure.

Figure 2:
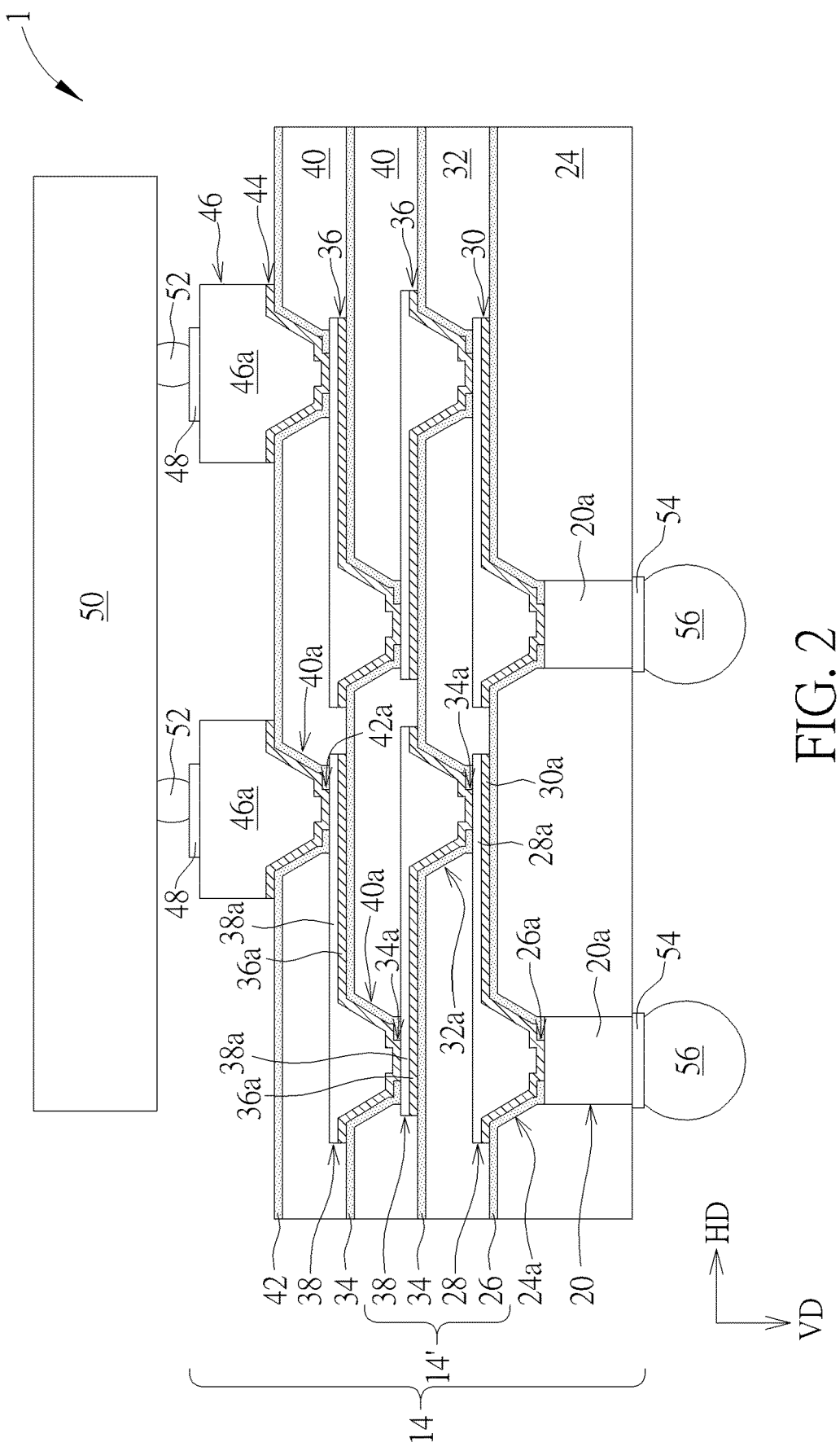

Refer to FIG. 1 and FIG. 2. FIG. 1 and FIG. 2 schematically illustrate cross-sectional views of a manufacturing method of a package device according to a first embodiment of the present disclosure, in which FIG. 2 schematically illustrates a cross-sectional view of the package device according to the first embodiment of the present disclosure. In the package device 1 shown in FIG. 1 and FIG. 2, the number of circuit layers, the number of isolation layers, and the number of through holes are as an example and are not limited to the structure shown in FIG. 1 and FIG. 2. As shown in FIG. 1, a carrier 12 is first provided to support a redistribution layer 14 formed later. The carrier 12 may include, for example, glass, a wafer, an electronic component, an electronic component surrounded by an encapsulation structure, or other substrates suitable for supporting the redistribution layer 14, in which the encapsulation structure may include, for example, polycarbonate (PC), polyimide (PI), polyethylene terephthalate (PET), resin, epoxy resin, and organosilicon compound, but not limited thereto. In some embodiments, the carrier 12 may include a flexible substrate disposed on a rigid carrier. The flexible substrate may include, for example, PI or PET, but not limited thereto. Then, a release layer 16 is formed on the carrier 12. The release layer 16 is used to separate the carrier 12 from formed components after subsequent steps are completed. The release layer 16 may include, for example, polyethylene (PE) release film, PET release film, oriented polypropylene (OPP) release film, composite release film (i.e., a substrate is made of two or more materials), etc., but not limited to this.

In some embodiments, as shown in FIG. 1, before forming the release layer 16, a de-warpage layer 18 may be provided on the carrier 12, so that the de-warpage layer 18 may be disposed between the carrier 12 and the release layer 16 and used to reduce warpage generated during fabricating the redistribution layer 14 in the following steps. For example, the de-warpage layer 18 may include insulating materials, like silicon nitride, silicon oxide, silicon oxynitride, other suitable materials, or a combination thereof.

As shown in FIG. 1, after the release layer 16 is formed, a circuit layer 20 is formed on the release layer 16. The circuit layer 20 may include at least one bottom bump 20a. In the embodiment of FIG. 1, the number of the bottom bumps 20a may be plural, but not limited thereto. The circuit layer 20 may include, for example, copper, titanium, aluminum, molybdenum, nickel, an alloy of any one metal thereof, or a combination of any two metals thereof, but not limited thereto. In some embodiments, before forming the circuit layer 20, a seed layer 22 may be formed on the release layer 16 to facilitate increasing bonding force between the circuit layer 20 and the release layer 16. The method for forming the circuit layer 20 may include the following steps. For example, a photoresist pattern may be formed on the seed layer 22, in which the photoresist pattern has at least one opening exposing a portion of the seed layer 22 corresponding to one of the bottom bumps 20a. Then, the circuit layer 20 is formed on the exposed seed layer 22. The circuit layer 20 may be formed by, for example, an electroplating process, an electroless plating process, a physical vapor deposition process, or other suitable processes. The photoresist pattern may be removed after the circuit layer 20 is formed. The seed layer 22 under the photoresist pattern may be exposed. The seed layer 22 may include, for example, titanium or other suitable materials, but not limited thereto. In the embodiment of FIG. 1, after the circuit layer 20 is formed, the seed layer 22 may be patterned to form at least one seed block 22a, but the present disclosure is not limited thereto. A maximum width of the seed block 22a in a horizontal direction HD (e.g., a direction parallel to a surface of the carrier 12 as shown in FIG. 1) may, for example, be greater than a maximum width of one of the bottom bumps 20a in the horizontal direction HD. In some embodiments, after the circuit layer 20 is formed, the seed layer 22 may not be patterned, and subsequent steps may be performed directly.

As shown in FIG. 1, an isolation layer 24 is then formed on the carrier 12, in which the isolation layer 24 has at least one through hole 24a exposing the corresponding one of the bottom bumps 20a. In the embodiment of FIG. 1, the number of the through holes 24a may be plural, but not limited thereto. The method for forming the isolation layer 24 may include, for example, a coating process in combination with a photolithography process, an exposure and development process, or a laser cutting process, etc., but not limited thereto. In some embodiments, the isolation layer 24 may include, for example, PI, photosensitive PI, resin, or other suitable dielectric materials, but not limited thereto.

As shown in FIG. 1, a de-warpage layer 26 is then formed on the isolation layer 24 and the circuit layer 20. The de-warpage layer 26 may be formed by, for example, a deposition process in combination with a patterning process. In the embodiment of FIG. 1, the de-warpage layer 26 may extend into the through holes 24a of the isolation layer 24 and has at least one opening 26a exposing at least a portion of the corresponding one of the bottom bumps 20a of the circuit layer 20. A minimum width of the opening 26a in the horizontal direction HD may be, for example, less than a minimum width of the corresponding one of the through holes 24a in the horizontal direction HD, but not limited thereto. The de-warpage layer 26 may include, for example, silicon nitride, silicon oxide, silicon oxynitride, other suitable materials, or a combination thereof.

As shown in FIG. 1, a circuit layer 28 is then formed on the de-warpage layer 26 and the circuit layer 20, in which the circuit layer 28 may include at least one trace 28a. The traces 28a may be electrically connected to one of the bottom bumps 20a through one of the through holes 24a and one of the openings 26a. It should be noted that since the de-warpage layer 26 is disposed between the isolation layer 24 and the circuit layer 28, stress between the isolation layer 24 and the circuit layer 28 may be mitigated, or stresses among the internal layers may tend to be balanced, thereby reducing warpage of the formed isolation layer 24 and the circuit layer 28. In one embodiment, the de-warpage layer 26 may separate the circuit layer 28 from the isolation layer 24 may reduce stress between the formed isolation layer 24 and the circuit layer 28, but not limited thereto. In addition, by forming the de-warpage layer 26 between the isolation layer 24 and the circuit layer 28, the bonding force between the isolation layer 24 and the circuit layer 28 may be improved. In one embodiment, a CTE of the de-warpage layer is different from a CTE of the circuit layer or the CTE of the de-warpage layer is different from a CTE of the isolation layer, which may reduce stress between the formed isolation layer 24 and the circuit layer 28, but not limited thereto.

In the embodiment of FIG. 1, between forming the de-warpage layer 26 and forming the circuit layer 28, another seed layer 30 may optionally be formed on the de-warpage layer 26 and the circuit layer 20 to facilitate the bonding force between the circuit layer 28 and the isolation layer 24. The method for forming the circuit layer 28 and the seed layer 30 may be, for example, similar to or the same as the method for forming the circuit layer 20 and the above-mentioned seed layer 22 and thus will not be repeated herein. In the embodiment of FIG. 1, after the circuit layer 28 is formed, the seed layer 30 may be patterned to form at least one seed block 30a. In some embodiments, the de-warpage layer 26 may be further patterned to remove at least a portion of the de-warpage 26 without overlapping the seed block 30a in a normal direction VD perpendicular to the top surface of the carrier 12 after the seed block 30a is formed, but not limited thereto.

Next, an isolation layer 32 is formed on the de-warpage layer 26 and the circuit layer 28, in which the isolation layer 32 has at least one through hole 32a to expose a portion of the corresponding trace 28a. In the embodiment of FIG. 1, the number of the through holes 32a may be multiple, but not limited thereto. The method for forming the isolation layer 32 may be, for example, similar to or the same as the method for forming the isolation layer 24 and will not be detailed redundantly. The isolation layer 32 may include, for example, polyimide, photosensitive polyimide, or other suitable dielectric materials, but not limited thereto.

As shown in FIG. 1, after the isolation layer 32 is formed, at least one de-warpage layer 34, at least one seed layer 36, at least one circuit layer 38, and at least one isolation layer 40 may be optionally formed on the isolation layer 32 and the circuit layer 28. Specifically, after the isolation layer 32 is formed, the de-warpage layer 34 is formed on the isolation layer 32 and the circuit layer 28, and then the circuit layer 38 is formed on the de-warpage layer 34 and the circuit layer 28, so that the de-warpage layer 34 is disposed between the isolation layer 32 and the circuit layer 38. The seed layer 36 may be optionally formed on the de-warpage layer 34 and the circuit layer 28 between forming the de-warpage layer 34 and forming the circuit layer 38. Accordingly, a redistribution unit 14' including the de-warpage layer 26, the seed layer 30, the circuit layer 28, the isolation layer 32, the de-warpage layer 34, the seed layer 36, the circuit layer 38, and the isolation layer 40 may be formed. The de-warpage layer 34 may have at least one opening 34a, and the circuit 38 may be electrically connected to the circuit layer 28 through the opening 34a. Since the methods for forming the de-warpage layer 34, the seed layer 36, the circuit layer 38, and the isolation layer 40 may be, for example, similar to or the same as the methods for forming the de-warpage layer 26, the seed layer 30, the circuit layer 28, and the isolation layer 32, respectively, and the materials of the de-warpage layer 34, the seed layer 36, the circuit layer 38, and the isolation layer 40 may be, for example, similar to or the same as the materials of the de-warpage layer 26, the seed layer 30, the circuit layer 28 and the isolation layer 32, respectively, so they are not repeated herein. In addition, by forming the de-warpage layer 34 between the isolation layer 32 and the circuit layer 38, the bonding force between the isolation layer 32 and the circuit layer 38 may be improved. The de-warpage layer 34 may have the same advantage as the de-warpage layer 26 and will not be repeated herein.

In the embodiment of FIG. 1, after the redistribution unit 14' is formed, another de-warpage layer 34 may be formed on the isolation layer 40 and the circuit layer 38, and then another circuit layer 38 may be formed on the another de-warpage layer 34 and the circuit layer 38, so that the another de-warpage layer 34 is disposed between the isolation layer 40 and the another circuit layer 38. Another seed layer 36 may be optionally formed on the another de-warpage layer 34 and the another circuit layer 38 between forming the another de-warpage layer 34 and forming the another circuit layer 38. In other words, the steps of forming the de-warpage layer 34, the seed layer 36, the circuit layer 38, and the isolation layer 40 may be performed twice to form two de-warpage layers 34, two seed layers 36, two circuit layer 38, and two isolation layers 40 on the isolation layer 32 and the circuit layer 28, but the present disclosure is not limited thereto. In some embodiments, the steps of forming the de-warpage layer 34, the seed layer 36, the circuit layer 38, and the isolation layer 40 may not be performed or may be performed one time or more than two times. In addition, a position of the opening 34a of each de-warpage layer 34, a layout pattern of the seed block 36a of each seed layer 36, a layout pattern of the trace 38a of each circuit layer 38, and a position of the through hole 40a of each isolation layer 40 may be adjusted according to requirements. In some embodiments, for example, the trace of the circuit layer 38 and the trace of the circuit layer 28 may have different layout patterns.

As shown in FIG. 1, a de-warpage layer 42 is then formed on the topmost isolation layer 40 and the topmost circuit layer 38. The method for forming the de-warpage layer 42 may be similar to or the same as the method for forming the de-warpage layer 26, and a material of the de-warpage layer 42 may be similar to or the same as the material of the de-warpage layer 26, so details are omitted herein. In the embodiment of FIG. 1, the de-warpage layer 42 may extend into the through hole 40a of the topmost isolation layer 40 and has at least one opening 42a exposing at least a portion of the corresponding trace 38a in the topmost circuit layer 38. Then, a seed layer 44 and a circuit layer 46 are formed on the de-warpage layer 42 and the topmost circuit layer 38. The methods for forming and patterning the seed layer 44 and the circuit layer 46 may, for example, be similar to or the same as the methods for forming and patterning the seed layer 30 and the circuit layer 28 and will not be repeated herein. The circuit layer 46 may include at least one top bump 46a for being electrically connected to an electronic component (such as the electronic component 50 shown in FIG. 2) or other circuit components. In some embodiments, the circuit layer 20, the circuit layer 28, the circuit layer 38, and the circuit layer 46 may include metal, in which the metal may include, for example, copper (Cu), titanium (Ti), aluminum (Al), molybdenum (Mo), nickel (Ni), other metals or alloys thereof, or any combination thereof, but not limited thereto.

As shown in FIG. 1, after the circuit layer 46 is formed, a plurality of top pads 48 may be optionally formed on the top bumps 46a of the circuit layer 46, respectively, so that the redistribution layer 14 of this embodiment may be formed. The top pads 48 may be formed on the corresponding top bumps 46a by, for example, the electroplating process, the electroless plating process, the physical vapor deposition process or other suitable processes, but the present disclosure is not limited thereto.

It should be noted that, as shown in FIG. 1, since the de-warpage layer 26 is disposed between the isolation layer 24 and the circuit layer 28, the de-warpage layer 34 is disposed between the isolation layer 32 and the circuit layer 38, another de-warpage layer 34 is disposed between the isolation layer 40, and another de-warpage 42 is disposed between the isolation layer 40 and the circuit layer 46, stresses among the internal layers tend to be balanced, or warpage of the isolation layer and the circuit layer formed in the steps of forming the redistribution layer 14 may be mitigated. For example, during forming one of the circuit layers, when viewed along the normal direction VD, a height difference between a level of the top surface of the circuit corresponding to a center of the carrier 12 and a level of the top surface of the circuit layer located at a position spaced apart from the center of the carrier 12 by a distance greater than 212 mm to 530 mm may be less than 1 mm.

In some embodiments, as shown in FIG. 2, after the top pads 48 are formed, an electronic component 50 may be optionally bonded to and electrically connected to the top pads 48 through a conductive adhesive 52. The electronic component 50 may include, for example, a capacitor, a resistor, an inductor, a diode, a printed circuit boards (PCB), a system on chip (SoC), a memory chip, an input/output device, a combination thereof, or other suitable components.

As shown in FIG. 1 and FIG. 2, after the step of forming the top pads 48 or the step of bonding the electronic component 50, the release layer 16 and the de-warpage layer 18 and the carrier 12 under the release layer 16 may be removed by a release process. The release process may include, for example, irradiating the release layer 16 with light or laser of a specific wavelength, heating or applying other suitable methods, but not limited thereto. In the embodiment of FIG. 2, after removing the release layer 16, the seed layer 22 may be optionally removed to expose bottom surfaces of the bottom bumps 20a, and then, bottom pads 54 are formed on the bottom surfaces of the bottom bump 20a, respectively. After that, conductive balls 56 are respectively formed on the bottom pads 54 to form the package device 1. The top pads 48 and the bottom pads 54 may, for example, include nickel-gold alloys or other suitable materials. The conductive balls 56 may include, for example, solder balls, but not limited thereto. In some embodiments, after the top pads 48 are formed, a cutting process may optionally be performed to divide the redistribution layer 14 into a plurality of portions. In this case, the step of removing the release layer 16 may be performed before or after the cutting process. The step of bonding the electronic component 50 may optionally be performed before or after the cutting process. Alternatively, the step of forming the conductive balls 56 may optionally be performed before or after the cutting process. In some embodiments, the redistribution layer 14 may include a fan-out circuit structure formed on a wafer, such as a redistribution circuit used to achieve a high density integrated circuit (IC), but not limited thereto. In some of the embodiments, the redistribution layer may include thin film transistor, capacitor, resistor or other suitable element, but not limited thereto.

As shown in FIG. 2, the package device 1 may at least include the isolation layer 24, the de-warpage layer 26, and the circuit layer 28, in which the isolation layer 24 and the circuit layer 28 are stacked on each other, and at least a portion of the de-warpage layer 26 is disposed between the isolation layer 24 and the circuit layer 28 to reduce warpage. That is, along the normal direction VD, the de-warpage layer 26 at least partially overlaps the isolation layer 24 and the circuit layer 28. In the embodiment of FIG. 2, the package device 1 may include the circuit layer 20, the isolation layer 24, the de-warpage layer 26, the seed layer 30, the circuit layer 28, the isolation layer 32, the de-warpage layer 34, the seed layer 36, the circuit layer 38, the isolation layer 40, the de-warpage layer 42, the seed layer 44, and the circuit layer 46, and at least one bottom bump 20a of the circuit layer 20 may be electrically connected to the corresponding top pad 46a of the circuit layer 46 through the circuit layer 28 and the circuit layer 38. In some embodiments, the number of circuit layers between circuit layer 20 and circuit layer 46 in package component 1 may be different from the number of layers shown in FIG. 2. In other words, in addition to the de-warpage layer 26, the seed layer 30, the circuit layer 28, and the isolation layer 32, the package device 1 may not include the de-warpage layer 34, the seed layer 36, the circuit layer 38, and the isolation layer 40, or may include at least one of the de-warpage layer 34, the seed layer 36, the circuit layer 38, and the isolation layer 40. According to the disclosure, the term "stacked on" may be understood that an element A at least partially overlaps another element B along the normal direction VD or another element C is disposed between the element A and the element B. For example, the seed layer 30 is disposed between the circuit layer 28 and the de-warpage layer 26.

As shown in FIG. 2, at least a portion of one of the de-warpage layers may be disposed between one of the isolation layers and one of the circuit layers, or between two isolation layers. In some embodiments, at least a portion of the de-warpage layer (e.g., the de-warpage layer 26) simultaneously contacts both one of the isolation layers adjacent to and on the de-warpage layer (e.g., the isolation layer 24) and another of the isolation layers adjacent to and under the de-warpage layer (e.g., the isolation layer 32). For example, a portion of the de-warpage layer 26 may be disposed between the isolation layer 24 and the isolation layer 32, a portion of the de-warpage layer 34 may be disposed between the isolation layer 32 and the circuit layer 38, and a portion of the de-warpage layer 42 is disposed between the isolation layer 40 and the circuit layer 46 may reduce warpage. In addition, in the embodiment of FIG. 2, the de-warpage layer 42 may be disposed on the top surface of the topmost isolation layer 40 on which the circuit layer 46 is not disposed. In some embodiments, at least one of the de-warpage layer 26, the de-warpage layer 34, and the de-warpage layer 42 of the package device 1 may include a plurality of blocks separated from each other, and each block may correspond to one of the seed blocks or one of traces, but not limited thereto. In some embodiments, package device 1 may not include all the de-warpage layers described above, but may include at least one of the de-warpage layer 26, the de-warpage layer 34, and the de-warpage layer 42.

The package device and the manufacturing method thereof are not limited to the above-mentioned embodiment and may include different embodiments. In order to simplify the description, different embodiments described below will use the same reference numbers to label components that are the same as those in the above embodiment. For clearly describing different embodiments, the following contents will describe differences between different embodiments, and the repeated parts will not be detailed redundantly.

Figure 3:
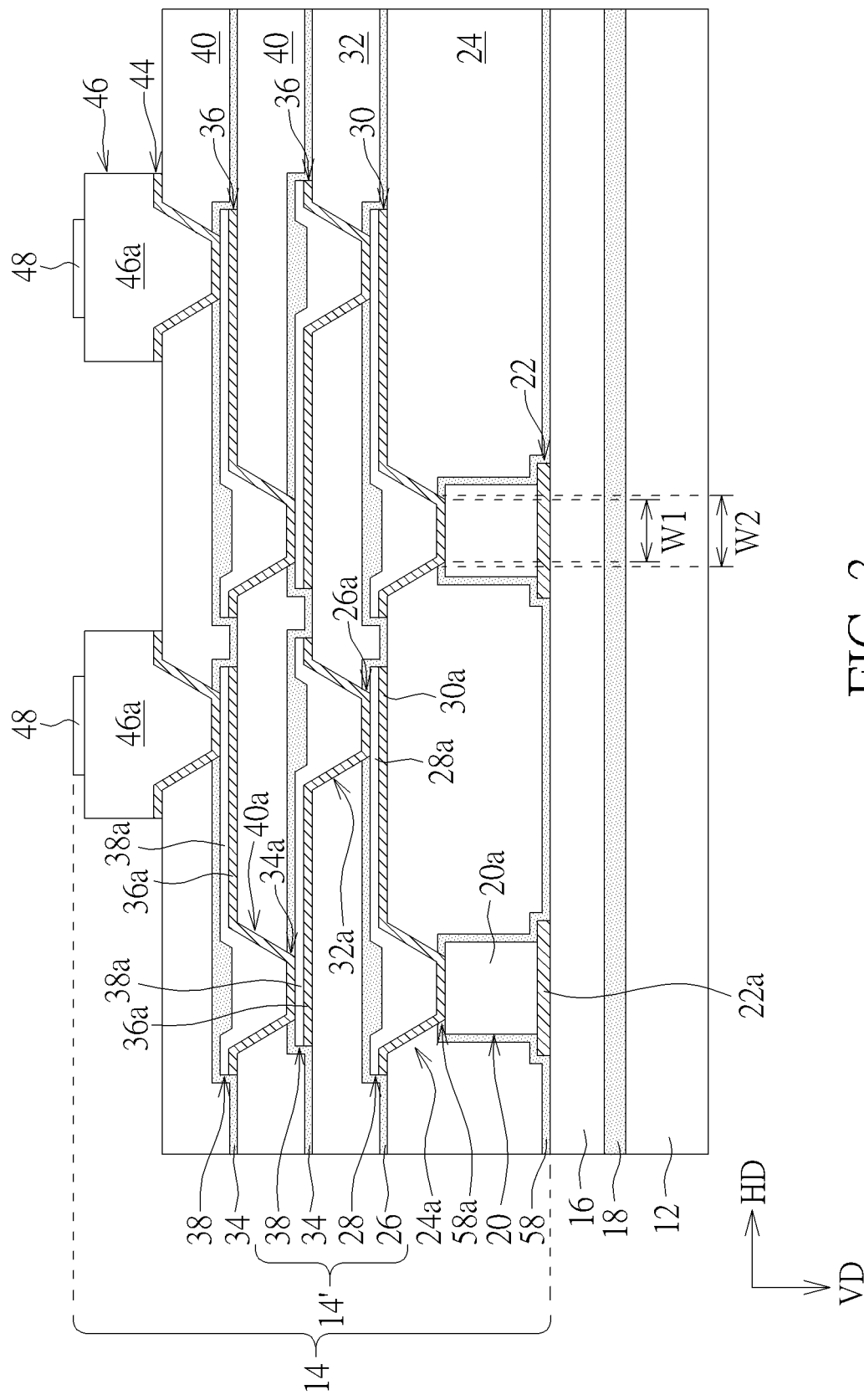
FIG. 3 and FIG. 4 schematically illustrate cross-sectional views of a manufacturing method of a package device according to a second embodiment of the present disclosure.
Figure 4:
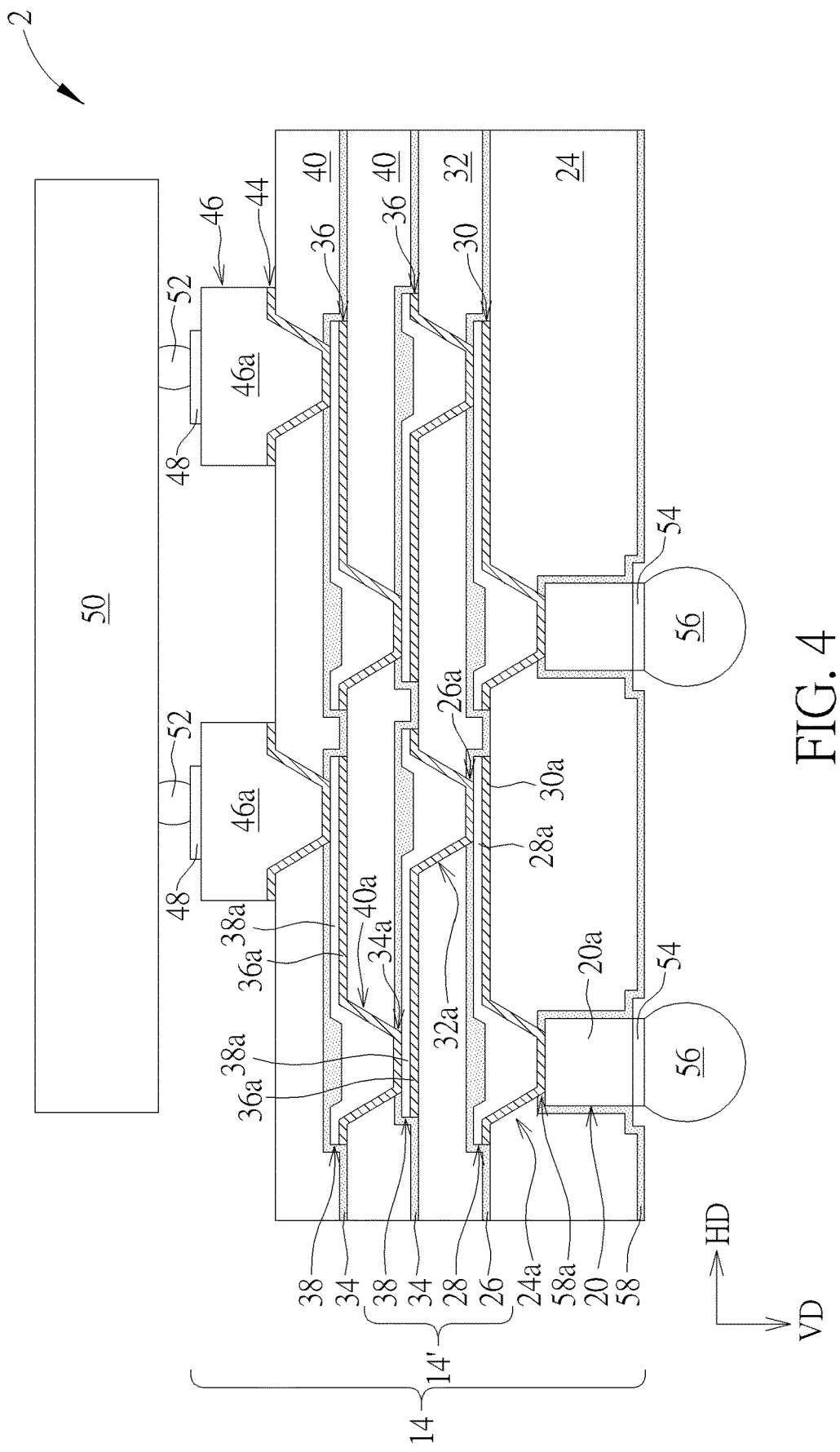

FIG. 3 and FIG. 4 schematically illustrate cross-sectional views of a manufacturing method of a package device according to a second embodiment of the present disclosure, in which FIG. 4 schematically illustrates a cross-sectional view of the package device according to the second embodiment of the present disclosure. As shown in FIG. 3 and FIG. 4, the manufacturing method of the package device 2 provided in this embodiment differs from the manufacturing method of FIG. 1 in that the de-warpage layer 26 may be formed between the step of forming the circuit layer 28 and the step of forming the isolation layer 32. Specifically, as shown in FIG. 3, after the carrier 12 and the release layer 16 are provided, the seed layer 22 and the circuit layer 20 may be formed on the release layer 16. The methods for forming the seed layer 22 and the circuit layer 20 may be similar to or the same as that of the above-mentioned embodiment and will not be detailed redundantly. In the embodiment of FIG. 3, before the isolation layer 24 is formed, a de-warpage layer 58 may be formed on the release layer 16, the seed layer 22, and the circuit layer 20, in which the de-warpage layer 58 may have at least one opening 58a exposing at least a portion of the corresponding one of the bottom bumps 20a of the circuit layer 20. Next, an isolation layer 24 is formed on the de-warpage layer 58, in which the isolation layer 24 may have at least one through hole 24a exposing at least a portion of the corresponding one of the bottom bumps 20a. In the embodiment of FIG. 3, a minimum width W2 of the through hole 24a in the horizontal direction HD may be greater than or equal to a minimum width W1 of the opening 58a of the de-warpage layer 58 in the horizontal direction HD. In some embodiments, the minimum width W2 of the through hole 24a may be less than the minimum width W1 of the opening 58a, such that the isolation layer 24 may contact the circuit layer 20.

As shown in FIG. 3, after the isolation layer 24 is formed, the seed layer 30 and the circuit layer 28 may be formed on the isolation layer 24. The methods of forming and/or patterning the seed layer 30 and the circuit layer 28 may be similar to or the same as that of the above-described embodiments, and will not be repeated in detail. Next, the de-warpage layer 26 is formed on the circuit layer 28 and the isolation layer 24, in which the de-warpage layer 26 has the opening 26a exposing the trace 28a of the circuit layer 28. Then, the isolation layer 32 is formed on the de-warpage layer 26, in which the isolation layer 32 may have at least one through hole 32a exposing the corresponding trace 28a. A minimum width of the through hole 32a in the horizontal direction HD may be greater than, equal to, or less than the minimum width of the opening 26a of the de-warpage layer 26 in the horizontal direction HD.

As shown in FIG. 3, after the isolation layer 32 is formed, at least one seed layer 36, at least one circuit layer 38, at least one de-warpage layer 34, and at least one isolation layer 40 may be optionally formed on the isolation layer 32 and the circuit layer 28. Specifically, after the isolation layer 32 is formed, the circuit layer 38 is formed on the isolation layer 32 and the circuit layer 28, the de-warpage layer 34 is formed on the circuit layer 38 and the isolation layer 32, and then the isolation layer 40 is formed on the de-warpage layer 34, so that at least a portion of the de-warpage layer 34 is disposed between the circuit layer 38 and the isolation layer 40. The seed layer 36 may be optionally formed on the isolation layer 32 and the circuit layer 38 between forming the isolation layer 32 and forming the circuit layer 38. Accordingly, a redistribution unit 14' including the de-warpage layer 26, the seed layer 30, the circuit layer 28, the isolation layer 32, the de-warpage layer 34, the seed layer 36, the circuit layer 38, and the isolation layer 40 may be formed. The circuit layer 38 may extend into the through hole 32a of the isolation layer 32. The circuit 38 may be electrically connected to the circuit layer 28 through the opening 26a. The de-warpage layer 26 may be disposed on a bottom surface of the isolation layer 32. The methods for forming the seed layer 36, the circuit layer 38, and the isolation layer 40 may be similar to or the same as that of the above-mentioned embodiment, and the materials of the seed layer 36, the circuit layer 38, and the isolation layer 40 may, for example, be respectively similar to or the same as those of the above-mentioned embodiment, so they are not detailed redundantly. It should be noted that, in the embodiment of FIG. 3, the step of forming the de-warpage layer 34 may be performed between the step of forming the circuit layer 38 and the step of forming the isolation layer 40, but not limited thereto. The de-warpage layer 34 may have the opening 34a exposing the trace 38a of the circuit layer 38, and a minimum width of the through hole 40a of the isolation layer 40 in the horizontal direction HD may be greater than or equal to the minimum width of the opening 34a of the de-warpage layer 34 in the horizontal direction HD. The method for forming the de-warpage layer 34 may be similar to or the same as the above-mentioned embodiment, and the material of the de-warpage layer 34 may be similar to or the same as the above-mentioned embodiment, so they are not detailed redundantly.

As shown in FIG. 3 and FIG. 4, after the topmost isolation layer 40 is formed, the seed layer 44, the circuit layer 46, and the top pads 48 may be formed, the electronic component 50 may be optionally disposed, the release layer 16, the de-warpage layer 18 and the carrier 12 may be removed, and the bottom pads 54 and the conductive balls 56 may be formed, thereby forming the package device 2. Since the steps mentioned above may be, for example, similar to or the same as the steps shown in FIG. 1, so they are not detailed redundantly. In the embodiment of FIG. 3, after the topmost isolation layer 40 is formed, the de-warpage layer may not be formed, but the present disclosure is not limited thereto.

As shown in FIG. 4, in the formed package device 2, at least a portion of the de-warpage layer 26 may be disposed between the circuit layer 28 and the isolation layer 32 disposed on the circuit layer 28, and at least a portion of the de-warpage layer 34 may be disposed between the corresponding circuit layer 38 and the corresponding isolation layer 40, and at least a portion of the de-warpage layer 58 may be disposed between the circuit layer 20 and the isolation layer 24, such that the stress between one of the circuit layers and one of the isolation layers, and the stresses among the internal layers may tend to be balanced, or the warpage is mitigated. The de-warpage layer 58 may be disposed on a bottom surface of the isolation layer 24. In addition, the de-warpage layer 26 and the de-warpage layer 34 may further facilitate increasing the bonding force between the circuit layer 28 and the isolation layer 32 and the bonding force between the circuit layer 38 and the isolation layer 40.

In the embodiment of FIG. 4, at least a portion of the de-warpage layer may be disposed between the two isolation layers. For example, a portion of the de-warpage layer 26 is disposed between the isolation layer 24 and the isolation layer 32, and a portion of the de-warpage layer 34 is disposed between the isolation layer 32 and the isolation layer 40. In addition, the de-warpage layer 58 may be further disposed on the bottom surface of the isolation layer 24. In some embodiments, at least one of the de-warpage layer 26, the de-warpage layer 34, and the de-warpage layer 58 of package component 2 may include a plurality of blocks spaced apart from each other (e.g., blocks 26 and/or blocks 34b shown in FIG. 5), and each block may respectively correspond to a seed block or a trace, but not limited thereto. In some embodiments, package device 2 may not include all the de-warpage layers described above, but may include at least one of the de-warpage layer 26, the de-warpage layer 34, and the de-warpage layer 58. In some embodiments, the embodiment of FIG. 3 and FIG. 4 may be mixed with the embodiment of FIG. 1 and FIG. 2, for example, other de-warpage layers may be formed between the isolation layer 24 and the circuit layer 28, between the isolation layer 32 and one of the circuit layers 38, between one of the isolation layers 40 and another of the circuit layers 38, and/or another of the isolation layers 40 and the circuit layer 46, but not limited thereto.

Figure 5:
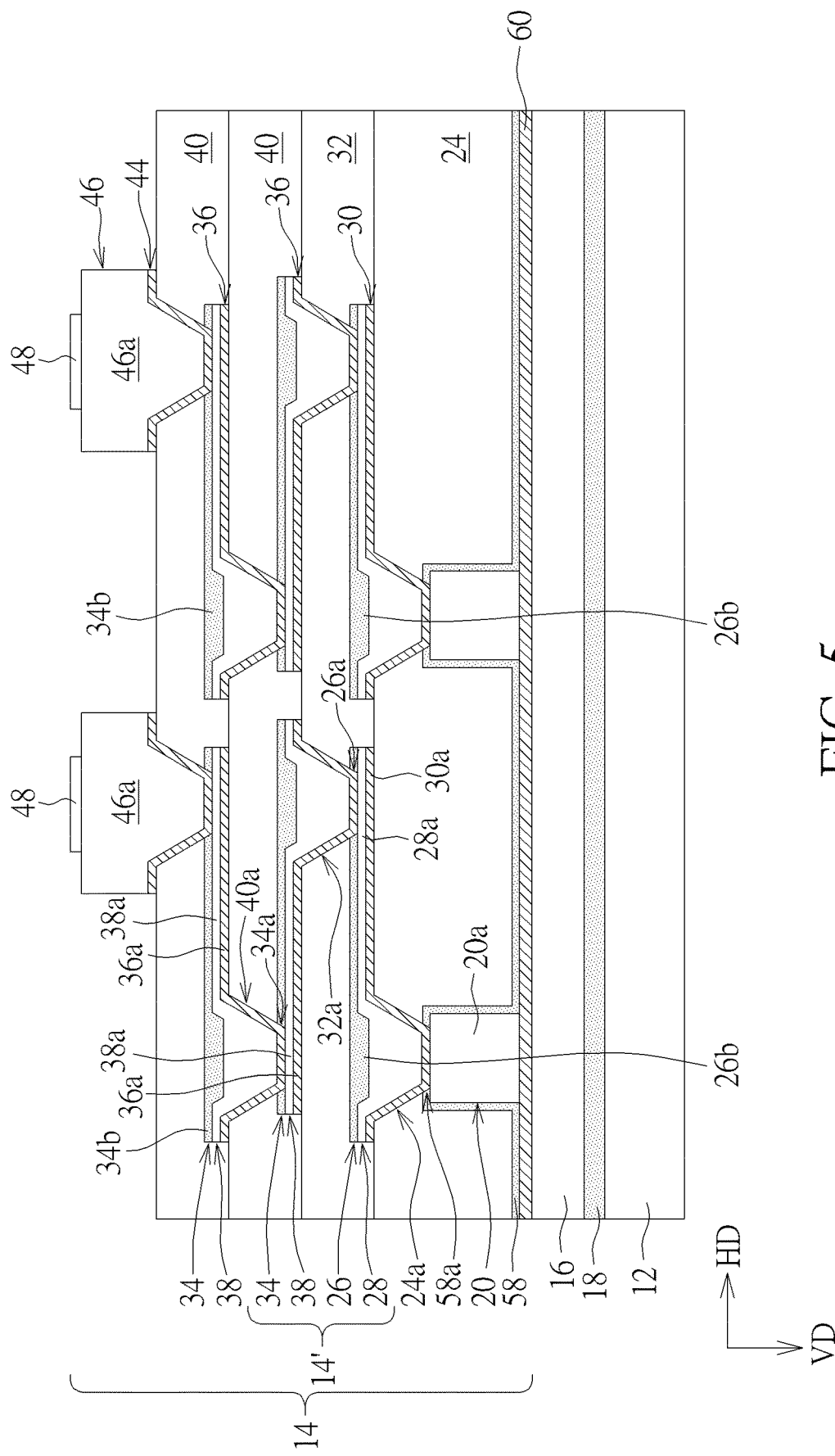
FIG. 5 schematically illustrates a cross-sectional view of a manufacturing method of a package device according to a third embodiment of the present disclosure.

FIG. 5 schematically illustrates a cross-sectional view of a manufacturing method of a package device according to a third embodiment of the present disclosure. As shown in FIG. 5, the manufacturing method provided in this embodiment differs from the manufacturing method shown in FIG. 3 in that after the circuit layer 20 is formed, a seed layer between the circuit layer 20 and the release layer 16 may not be patterned, such that the seed layer 60 may cover an entire surface of the release layer 16. In this case, between the step of forming the isolation layer 24 and the step of removing the release layer 16, the de-warpage layer 58 and the seed layer 60 may be disposed between the isolation layer 24 and the release layer 16. In the embodiment of FIG. 5, after the circuit layer 20 is formed, the photoresist pattern may be removed, and then, a de-warpage layer 58 may be formed. Since the method for forming the de-warpage layer 58 is the same as or similar to that of the embodiment in FIG. 3, it will not be repeated in detail.

In the embodiment of FIG. 5, the de-warpage layer 26 and the de-warpage layer 34 may include a plurality of blocks (e.g., blocks 26b and blocks 34b) separated from each other, and each block may respectively correspond to one of the trace 28a and the trace 38a, so that one of the de-warpage layers (e.g., the de-warpage layer 26 or the de-warpage layer 34) does not contact both one of the isolation layers adjacent thereto and thereon (e.g., the isolation layer 32 or the isolation layer 40) and one of the isolation layers adjacent thereto and thereunder (e.g., the isolation layer 24 or the isolation layer 32), but not limited thereto. The isolation layer 32 adjacent to and on the de-warpage layer 26 may contact the circuit layer 28 under the de-warpage layer 26. The isolation layer 40 adjacent to and on the de-warpage layer 34 may contact the circuit layer 34 under the de-warpage layer 34. In some embodiments, a portion of the de-warpage layer (e.g., the de-warpage layer 26 or the de-warpage layer 34) may be in contact with both one of the isolation layers adjacent thereto and thereon and one of the isolation layers adjacent thereto and thereunder after being patterned. A maximum width of each block of the de-warpage layer 26 and the de-warpage layer 34 in the horizontal direction HD may be the same as or different from a width of the corresponding trace. The present disclosure is not limited that all of the de-warpage layer 26 and the de-warpage layers 34 are patterned into blocks. In some embodiments, at least one of the de-warpage layer 26 and the de-warpage layers 34 may not be patterned, and other of the de-warpage layer 26 and the de-warpage layers 34 may include blocks spaced apart from each other (e.g., blocks 26b or blocks 34b). In this embodiment, the seed layer 60 may be removed or patterned after the release layer 16 is removed, and then, the bottom pads 54 and the conductive balls 56 are formed, as shown in FIG. 4. In some embodiments, the embodiment of FIG. 5 may further be mixed with the embodiment of FIG. 1 and FIGS. 2, that is, at least one de-warpage layer may be disposed by adopting the structure shown in FIG. 1 and FIG. 2, but not limited thereto.

Figure 6:
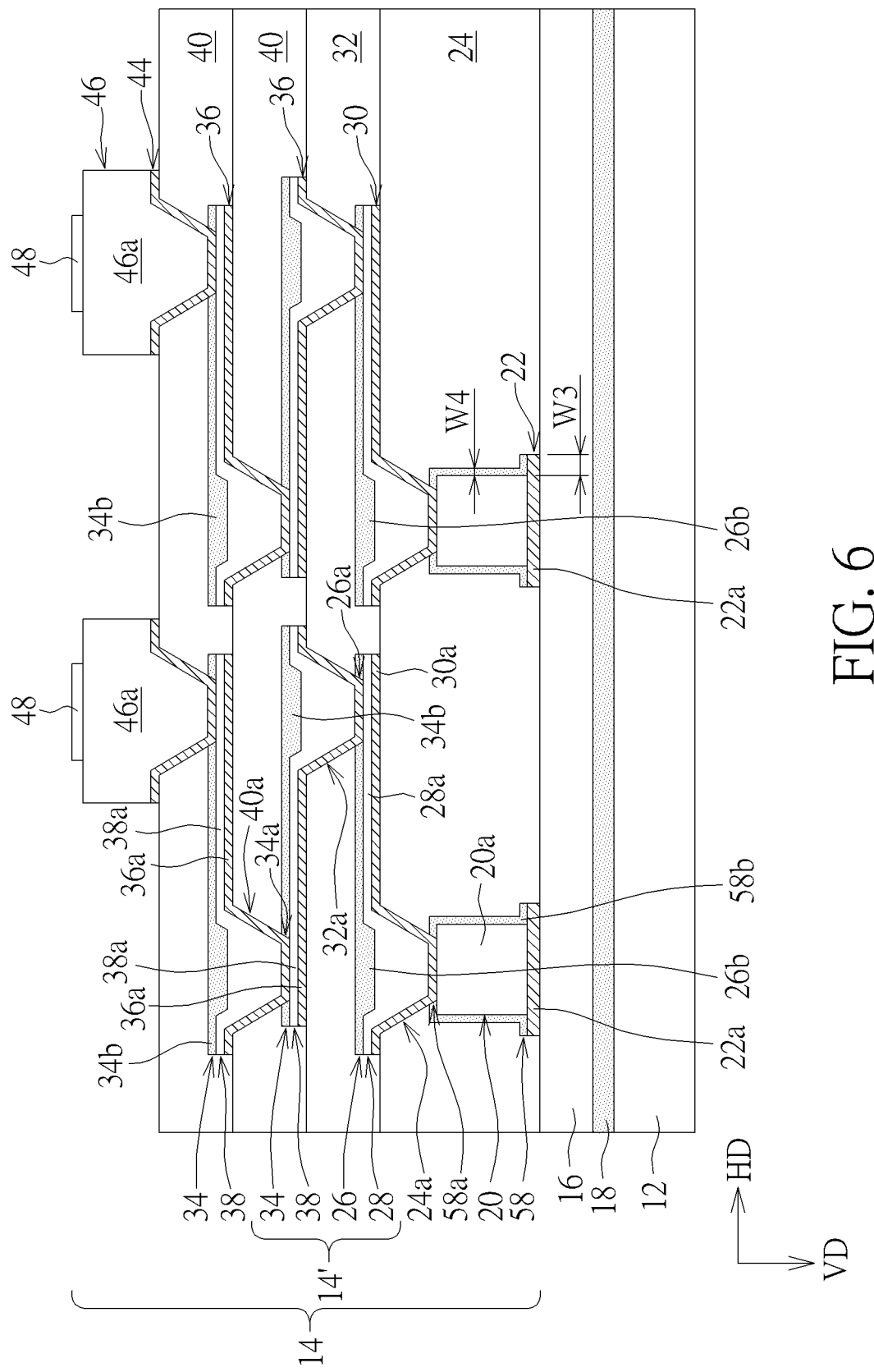
FIG. 6 and FIG. 7 schematically illustrate cross-sectional views of a manufacturing method of a package device according to a fourth embodiment of the present disclosure.
Figure 7:
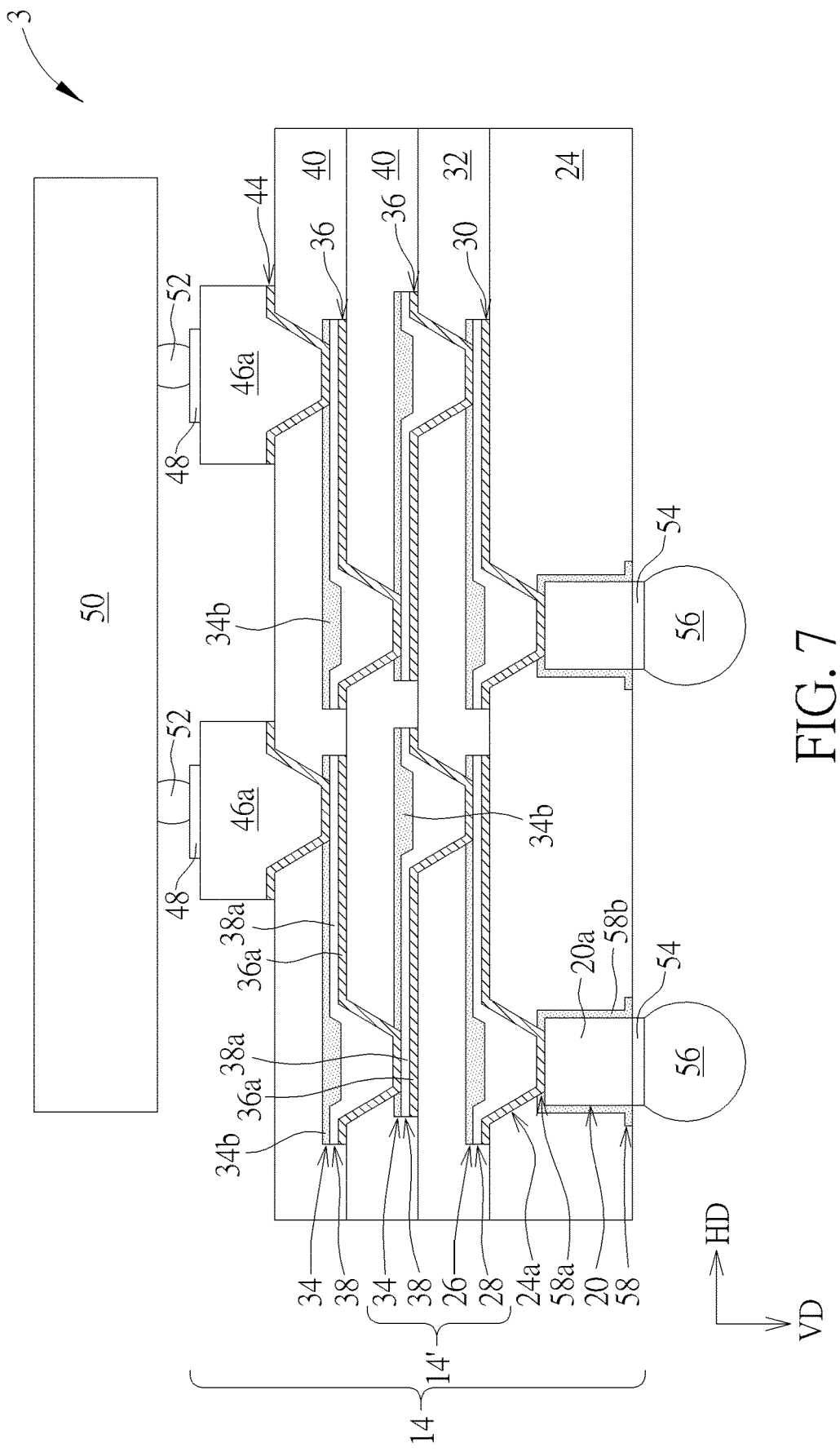

FIG. 6 and FIG. 7 schematically illustrate cross-sectional views of a manufacturing method of a package device according to a fourth embodiment of the present disclosure. As shown in FIG. 6, the manufacturing method of the package device 3 provided in this embodiment differs from the manufacturing method shown in FIG. 5 in that the seed layer 22 between the circuit layer 20 and the release layer 16 may not be patterned after the circuit layer 20 is formed and may be patterned to form the seed block 22a after the de-warpage 58 is formed. In this case, the step of forming the de-warpage layer 58 not only forms openings 58a at the position of the de-warpage layer 58 corresponding to the circuit layer 20 but also removes a portion of the de-warpage layer 58 without contacting the circuit layer 20, such that the de-warpage layer 58 may include a plurality of blocks 58b separated from each other. In the embodiment of FIG. 6, the blocks 58b may be disposed between the isolation layer 24 and the bottom bumps 20a, and for example, the isolation layer 24 may be separated from the bottom bumps 20a respectively by the blocks 58b. In some embodiments, in order to reduce exposure of the circuit layer 20 in the step of forming the de-warpage layer 58, the maximum width W3 of the portion of one of the block 58b contacting one of the seed blocks 22a may be greater than a thickness W4 of one of the blocks 58b, but not limited thereto.

As shown in FIG. 6, in the manufacturing method of this embodiment, the step of forming the isolation layer 24 to the step of forming the top pads 48 may be the same as or similar to that in the manufacturing method shown in FIG. 5 and will not be repeated herein. As shown in FIG. 7, the steps after forming the top pads 48 may be the same as or similar to the steps shown in FIG. 4 so as to form the package device 3, and they will not be repeated herein. In some embodiments, the embodiment of FIG. 6 and FIG. 7 may further be mixed with the embodiment of FIG. 1 and FIG. 2, that is, at least one de-warpage layer may adopt the structure shown in FIG. 1 and FIG. 2, but not limited thereto.

Figure 8:
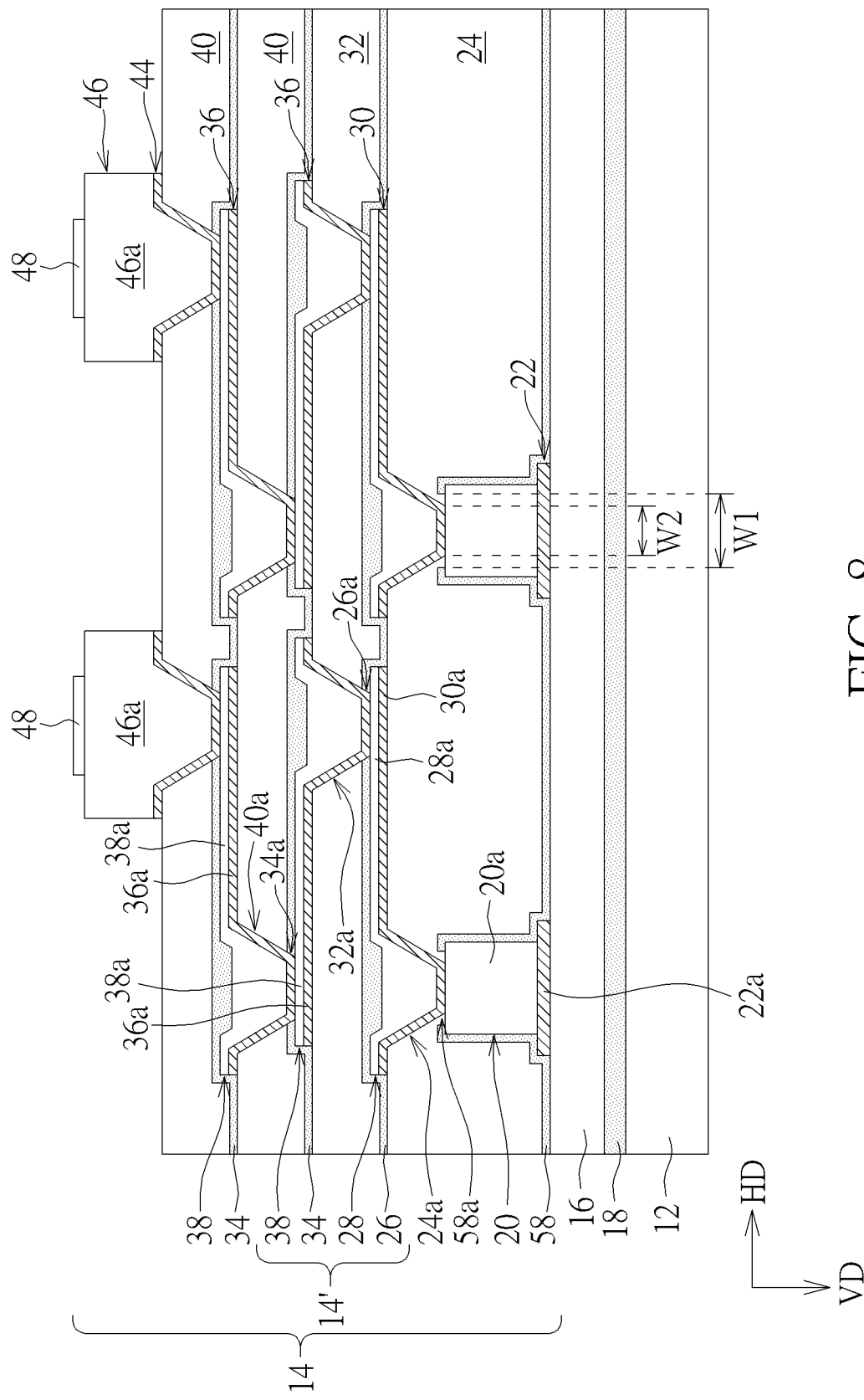
FIG. 8 and FIG. 9 schematically illustrate cross-sectional views of a manufacturing method of a package device according to a fifth embodiment of the present disclosure.
Figure 9:
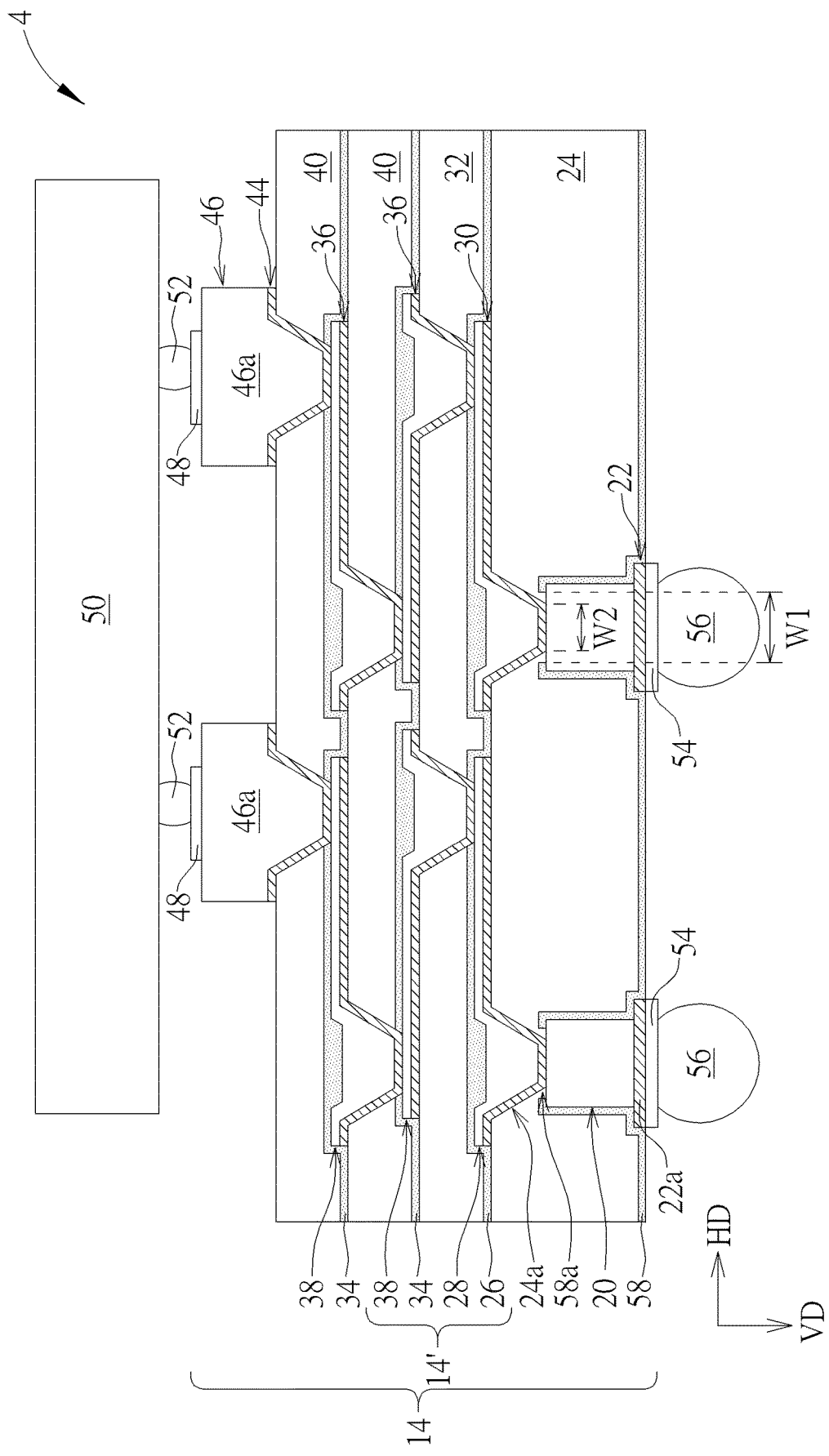

FIG. 8 and FIG. 9 schematically illustrate cross-sectional views of a manufacturing method of a package device according to a fifth embodiment of the present disclosure. As shown in FIG. 8, the manufacturing method of the package device 4 provided in this embodiment differs from the manufacturing method shown in FIG. 3 in that the minimum width W1 of one of the openings 58a of the de-warpage layer 58 in the horizontal direction HD may be greater than the minimum width W2 of one of the through holes 24a of the isolation layer 24 in the horizontal direction HD. Therefore, the isolation layer 24 may contact the bottom bumps 20a of the circuit layer 20 through the openings 58a. As shown in FIG. 8 and FIG. 9, other portions in the manufacturing method of the package device 4 in this embodiment may be the same as or similar to that of the manufacturing method shown in FIG. 3 and will not be described again.

In some embodiments, the minimum width of one of the openings 26a of the de-warpage layer 26 in the horizontal direction HD may also be greater than the minimum width of one of the through holes 32a of the isolation layer 32 in the horizontal direction HD, so that the isolation layer 32 may contact the circuit layer 28 through the openings 26a, and/or the minimum width of one of the openings 34a of the de-warpage layer 34 in the horizontal direction HD may be greater than the minimum width of one of the through holes 40a of the isolation layer 40 in the horizontal direction HD, such that the isolation layer 40 may contact the circuit layer 38 through the openings 34a, but not limited thereto.

In some embodiments, as shown in FIG. 9, after the step of removing the release layer 16, the seed blocks 22a of the seed layer 22 may optionally remain, and the bottom pads 54 and the conductive balls 56 may be formed on the bottom surface of the seed layer 22, but the present disclosure is not limited thereto. In some embodiments, the embodiment of FIG. 8 and FIG. 9 may further be mixed with the embodiment of FIG. 1 and FIG. 2, that is, at least one de-warpage layer may adopt the structure shown in FIG. 1 and FIG. 2, but not limited thereto.

Figure 10:
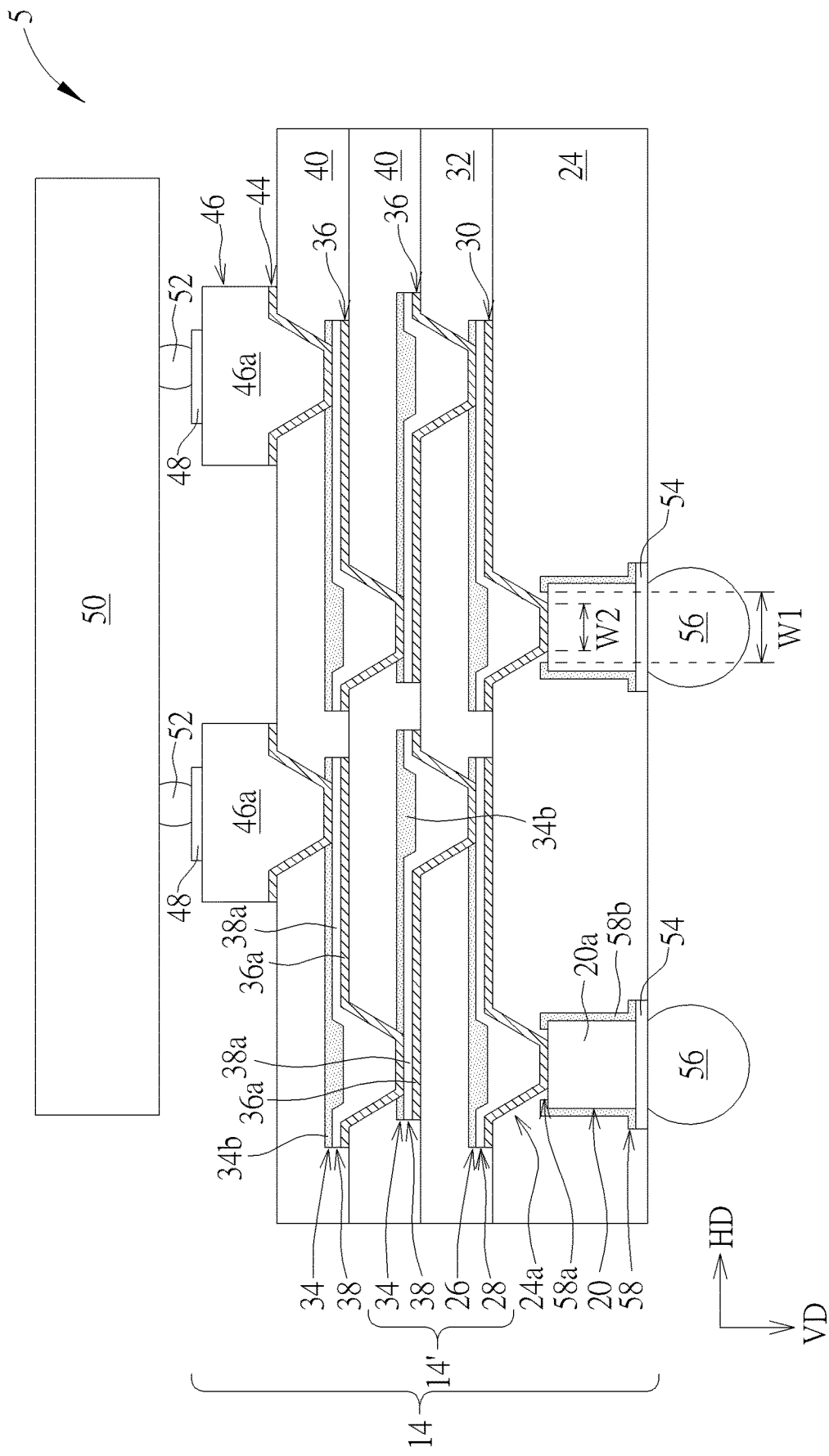
FIG. 10 schematically illustrates a cross-sectional view of a package device according to a sixth embodiment of the present disclosure.

FIG. 10 schematically illustrates a cross-sectional view of a package device according to a sixth embodiment of the present disclosure. As shown in FIG. 10, the package device 5 provided in this embodiment differs from the package device 3 shown in FIG. 7 in that the minimum width W1 of one of the openings 58a of the de-warpage layer 58 in the horizontal direction HD may be greater than the minimum width W2 of one of the through holes 24a of the isolation layer 24 in the horizontal direction HD. Accordingly, the isolation layer 24 may contact the bottom bumps 20a of the circuit layer 20 through the openings 58a. As shown in FIG. 10, the manufacturing method of the package device 5 in this embodiment may be the same as or similar to the manufacturing method shown in FIG. 7, and thus will not be described again. In some embodiments, the embodiment of FIG. 10 may further be mixed with the embodiments of FIG. 1 and FIG. 2, that is, at least one de-warpage layer may adopt the structure shown in FIG. 1 and FIG. 2, but not limited thereto.

Figure 11:
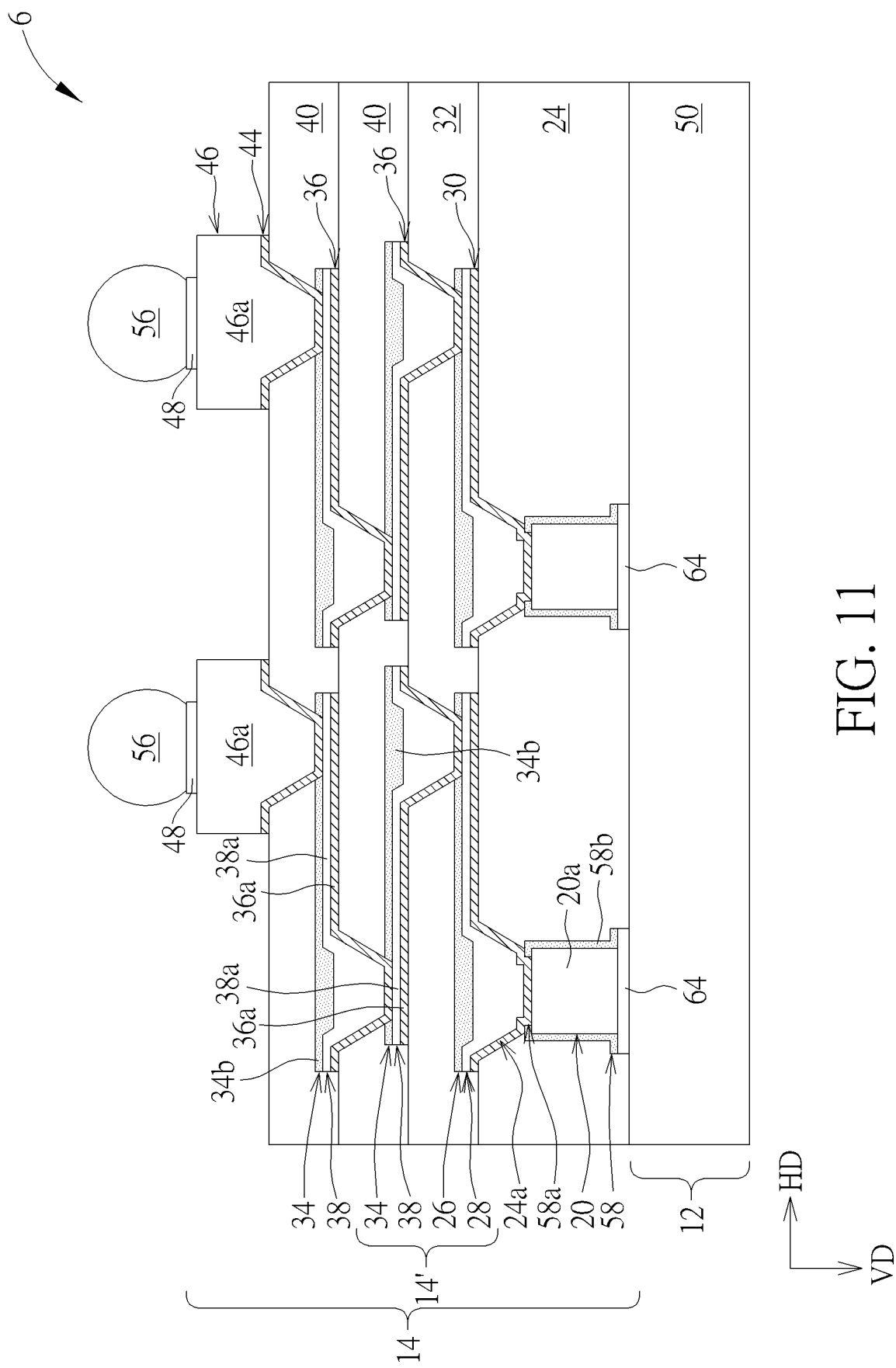
FIG. 11 schematically illustrates a cross-sectional view of a package device according to a seventh embodiment of the present disclosure.

FIG. 11 schematically illustrates a cross-sectional view of a package device according to a seventh embodiment of the present disclosure. As shown in FIG. 11, the package device 6 provided in this embodiment differs from the package device 3 shown in FIG. 7 in that the redistribution layer 14 may be disposed on the carrier 12, and the carrier 12 may be included in the package device 6. In other words, in the manufacturing method of the package device 6, the redistribution layer 14 may be formed on the carrier 12, and the carrier 12 does not need to be removed after the redistribution layer 14 is formed. The package device 6 may be formed by, for example, a chip first process, but not limited thereto. The carrier 12 may include, for example, a wafer, an electronic component 50, an electronic component 50 surrounded by an encapsulation structure, or other components suitable for supporting the redistribution layer 14 and without being removed from the redistribution layer 14. The electronic component 50 may include, for example, a chip, but not limited thereto. In the embodiment of FIG. 11, the carrier 12 may include a wafer, and the redistribution layer 14 may be disposed on the wafer, but not limited thereto. The wafer may, for example, include at least one electronic component 50, and the electronic component 50 may have a plurality of pads 64. The redistribution layer 14 may, for example, be electrically connected to the corresponding pads 64, but not limited thereto. The redistribution layer 14 of the embodiment of FIG. 11 is different from the redistribution layer 14 of FIG. 7 in that the bottom pads may not be included, and the redistribution layer 14 may be directly formed on the pads 64 of the electronic component 50, so that traces 142a of the conductive layer 142 may be electrically connected to the pads 44, but the present disclosure is not limited thereto. The pads 64 may include, for example, conductive bumps or conductive pads, but not limited thereto. In some embodiments, the redistribution layer 14 may adopt the redistribution layer of any of the above embodiments, and the bottom pads of the redistribution layer 14 are respectively disposed on the corresponding pads 64 of the electronic component 50. Since other parts of the redistribution layer 14 of this embodiment may be the same as any of the redistribution layers 14 shown in FIG. 1 to FIG. 10, they will not be repeated herein.

In the manufacturing method of the embodiment shown in FIG. 11, the electronic component 50 may be disposed on another carrier (not shown) by a chip first process with a surface of the electronic component 50 having the pads 64 facing downward, and then an encapsulation process is performed to form an encapsulation structure on the electronic component 50. Next, the another carrier is removed, and the electronic component 50 and the encapsulation structure are turned upside down, such that the surface of the electronic component 50 with the pads 64 faces up. After that, the redistribution layer 14 is formed on the electronic component 50 and the encapsulation structure. The method for forming the redistribution layer 14 may be, for example, the same as or similar to the method for forming the redistribution layer shown in FIG. 7, and thus will not be repeated herein. In some embodiments, the method for forming the redistribution layer 14 shown in FIG. 11 may adopt the method for forming the redistribution layer in any of the above-mentioned embodiments or modified embodiments, but not limited thereto. After the redistribution layer 14 or other subsequent processes are completed, the redistribution layer 14 may be subjected to a cutting process to form the package device 6 including the electronic component 50. In some embodiments, conductive balls 56 may be optionally disposed on the top bumps 46a of the redistribution layer 14 to facilitate electrical connection with other electronic components.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A package device, comprising:
 a first circuit layer;
 a first isolation layer, wherein the first circuit layer and the first isolation layer are stacked on each other; and
 a first de-warpage layer, wherein along a direction perpendicular to a normal direction of the package device, at least a portion of the first de-warpage layer is disposed between the first circuit layer and the first isolation layer, and wherein the first de-warpage layer comprises an insulating material.

2. The package device according to claim 1, wherein the first circuit layer is disposed on the first isolation layer.

3. The package device according to claim 2, further comprising a second isolation layer disposed on the first circuit layer and the first isolation layer, wherein the first de-warpage layer is disposed between the first isolation layer and the second isolation layer.

4. The package device according to claim 3, wherein the at least a portion of the first de-warpage layer contacts both the first isolation layer and the second isolation layer.

5. The package device according to claim 3, further comprising:
 a second circuit layer disposed on the second isolation layer; and
 a second de-warpage layer disposed between the second isolation layer and the second circuit layer.

6. The package device according to claim 5, wherein the second de-warpage layer has at least one opening, and the second circuit layer is electrically connected to the first circuit layer through the at least one opening.

7. The package device according to claim 2, wherein the first isolation layer has at least one through hole, and the first de-warpage layer extends into the at least one through hole.

8. The package device according to claim 2, further comprising a seed layer disposed between the first de-warpage layer and the first circuit layer.

9. The package device according to claim 1, wherein the first isolation layer is disposed on the first circuit layer.

10. The package device according to claim 9, further comprising:
 a second circuit layer disposed on the first isolation layer;
 a second isolation layer disposed on the second circuit layer and the first isolation layer; and
 a second de-warpage layer, wherein at least a portion of the second de-warpage layer is disposed between the second circuit layer and the second isolation layer.

11. The package device according to claim 10, wherein the first isolation layer has at least one through hole, and the second circuit layer extends into the at least one through hole.

12. The package device according to claim 10, wherein the first de-warpage layer has at least one opening, and the second circuit layer is electrically connected to the first circuit layer through the at least one opening.

13. The package device according to claim 10, further comprising a seed layer disposed between the first isolation layer and the second circuit layer.

14. The package device according to claim 10, wherein the second de-warpage layer is disposed between the first isolation layer and the second isolation layer.

15. The package device according to claim 9, wherein the first de-warpage layer is disposed on a bottom surface of the first isolation layer.

16. The package device according to claim 9, wherein the first circuit layer comprises a plurality of traces, the first de-warpage layer comprises a plurality of blocks separated from each other, and one of the plurality of blocks corresponds to one of the plurality of traces.

17. The package device according to claim 1, wherein the first de-warpage layer separates the first circuit layer from the first isolation layer.

18. The package device according to claim 1, further comprising an electronic component disposed on the first circuit layer, the first isolation layer, and the first de-warpage layer.

19. The package device according to claim 1, further comprising a carrier comprising an electronic component, wherein the first circuit layer, the first isolation layer, and the first de-warpage layer are disposed on the carrier.

20. A package device, comprising:
 a first circuit layer;
 a first isolation layer, wherein the first circuit layer and the first isolation layer are stacked on each other; and
 a first de-warpage layer, wherein at least a portion of the first de-warpage layer is disposed between the first circuit layer and the first isolation layer,
 wherein the first isolation layer contacts the first circuit layer and the first de-warpage layer comprises an insulating material.

* * * * *